United States Patent [19]
Park

[11] Patent Number: 5,867,070
[45] Date of Patent: Feb. 2, 1999

[54] VOLTAGE CONTROLLED EMITTER-COUPLED MULTIVIBRATOR

[75] Inventor: Hyun-Jin Park, Kyeongki-Do, Rep. of Korea

[73] Assignee: Daewoo Electronics Co., Ltd., Seoul, Rep. of Korea

[21] Appl. No.: 867,021

[22] Filed: May 30, 1997

[30] Foreign Application Priority Data

Dec. 28, 1996 [KR] Rep. of Korea .................. 1996-75311

[51] Int. Cl.$^6$ .................................................. H03K 3/282
[52] U.S. Cl. .................. 331/113 R; 331/144; 331/177 R
[58] Field of Search ................................. 331/113 R, 144, 331/177 R

[56] References Cited

U.S. PATENT DOCUMENTS 4,083,019  4/1978  Hamada et al. ..................... 331/113 R
4,749,961  6/1988  Kato et al. .................................. 331/14

Primary Examiner—Siegfried H. Grimm
Attorney, Agent, or Firm—Pillsbury Madison & Sutro LLP

[57] ABSTRACT

A voltage controlled emitter-coupled multivibrator in which a frequency range of an oscillating signal and a frequency within the frequency range can be adjusted. An emitter-coupled multivibrator is provided with an emitter follower buffer having first and second transistors, a gain stage having third and fourth transistors which are cross-coupled through the first and second transistors, and a current source connected to emitters of the third and the fourth transistors, and generates first and second oscillating frequency signals. An outputting section compares a first voltage level of the first oscillating signal with a second voltage level of the second oscillating signal and outputs a compared signal having a predetermined voltage level. A controlling section outputs a controlling current which controls an amount of a current which flows through the current source of the emitter-coupled multivibrator. The oscillating frequency and the oscillating frequency range can be adjusted by inputting two controlling voltages via the controlling section. Therefore, the oscillating signal which has a wide range of frequencies from a low frequency to a high frequency can be obtained.

8 Claims, 6 Drawing Sheets

$V_{E2}$ — $V_{CC}-V_{BE}$ / $V_{CC}-2V_{BE}$ / $V_{CC}-3V_{BE}$ $V_{E1}$ — $V_{CC}-V_{BE}$ / $V_{CC}-2V_{BE}$ / $V_{CC}-3V_{BE}$ $V_{E2} - V_{E1}$ — $V_{BE}$ / $0$ / $-V_{BE}$

VOLTAGE CONTROLLED EMITTER-COUPLED MULTIVIBRATOR

BACKGROUND OF THE INVENTION

1. Field of the Invention

The present invention relates to a voltage controlled emitter-coupled multivibrator, and more particularly to a voltage controlled emitter-coupled multivibrator which can determine an oscillating frequency range and adjust the height of a frequency within the determined frequency range.

2. Description of the Prior Art

A voltage controlled oscillator is utilized in a phase locked loop (PLL) or a frequency combining apparatus, and particularly in the PLL for identifying the frequency of an outputting signal with a predetermined frequency. An example of the voltage controlled oscillator used in the PLL is disclosed in U.S. Pat. No. 4,749,961 (issued to Kato et al., on Jun. 7, 1988). Most voltage controlled oscillators make an oscillation by charging or discharging a capacitor through switching the amount of current controlled by an inputting voltage. The EC multivibrator is one of a relaxation oscillator using symmetric charging and discharging with respect to a timing capacitor connected between emitters of a differential gain stage.

FIG. 1 is a block diagram illustrating the constitution of the conventional EC multivibrator voltage controlled oscillator 10. In the conventional EC multivibrator voltage controlled oscillator 10, a gain stage 11 is comprised of a pair of first and second transistors Q1 and Q2. First and second transistors Q1 and Q2 are cross coupled through an emitter-follower buffer stage 12. First and second transistors Q1 and Q2 of gain stage 11 have equal load resistors R1 and R2 with clamping diodes D1 and D2, and are clamped to $IV_{BE}(=0.7)$ by clamping diodes D1 and D2. The emitters of first and second transistors Q1 and Q2 are biased by current sources $I_1$ and are coupled through a timing capacitor $C_1$.

The operation of the conventional EC multivibrator voltage controlled oscillator 10 having the above described constitution, will be explained.

Since first and second transistors Q1 and Q2 of gain stage 11 are combined by first and second transistors Q3 and Q4 of emitter follower buffer stage 12, either first or second transistor Q1 or Q2 (but not both) is on at any one time. In this manner, timing capacitor $C_1$ is alternately charged with equal but opposite currents.

First, assuming for the moment that first transistor Q1 is off and second transistor Q2 is on, at the emitter of second transistor Q2 a total current of 2I flows, where one-half of the current is forced through timing capacitor $C_1$. At this time, $V_{B4}=V_{CC}-V_{BE}$ (FIG. 2A), $V_{E4}=V_{B1}=V_{CC}-V_{BE}$ (FIG. 2D), and $V_{B3}=V_{CC}$ (FIG. 2B) when ignoring the base current of first transistor Q3, $V_{E3}=V_{B2}=V_{CC}-V_{BE}$ (FIG. 2C) and $V_{E2}=V_{CC}-V_{BE}$ (FIG. 2E).

Since first transistor Q1 is off, the current I charging timing capacitor $C_1$ is obtained from the emitter of second transistor Q2. This current I causes the voltage level $V_{E1}$ at the emitter of first transistor Q1 to decline at a constant slope of $I/C_1$ until the voltage level at the emitter of first transistor Q1 becomes equal to $V_{CC}-3V_{BE}$, as illustrated in FIG. 2F. At this time, first transistor Q1 is on.

When first transistor Q1 is on, first diode D1 is on, $V_{B3}=V_{CC}-V_{BE}$ (FIG. 2B), and $V_{E3}=V_{B2}=V_{CC}-2V_{BE}$ (FIG. 2C) and second transistor Q2 is off. When second transistor Q2 is off, $V_{B4}=V_{CC}$ (FIG. 2A), $V_{E4}=V_{B1}=V_{CC}-V_{BE}$ (FIG. 2D) and $V_{E1}=V_{CC}-2V_{BE}$ (FIG. 2F). At this time, timing capacitor $C_1$ discharges in the opposite direction with constant current I through second transistor Q2. When $V_{E1}=V_{CC}-3V_{BE}$ (FIG. 2F), the oscillator is changed into its prior state to oscillate a constant frequency signal ($V_{E2}-V_{E1}$ in FIG. 2G) through the operation.

However, in the above-mentioned conventional EC multivibrator voltage controlled oscillator, the oscillating frequency range cannot be established and the oscillating frequency cannot be adjusted.

SUMMARY OF THE INVENTION

Accordingly, it is an object of the present invention considering the above-mentioned defects, to provide a voltage controlled emitter-coupled multivibrator which can determine the oscillating frequency range and adjust the frequency within the determined frequency range.

To accomplish the above object, there is provided in the present invention, a voltage controlled oscillator comprising an emitter-coupled multivibrator for generating first and second oscillating signals, the emitter-coupled multivibrator being provided with an emitter follower buffer having first and second transistors, a gain stage having third and fourth transistors which are cross coupled through the first and second transistors and a current source connected to emitters of the third and the fourth transistors, an outputting section for comparing a first voltage level of the first oscillating signal with a second voltage level of the second oscillating signal and outputting a compared signal having a predetermined voltage level, and a controlling section for outputting a controlling current which controls an amount of a current which flows through the current source of the emitter-coupled multivibrator by receiving a first controlling voltage for controlling a frequency range of the compared signal outputted through the outputting section, and by receiving a reference voltage of the compared signal and a second controlling voltage for controlling a frequency of the compared signal.

In the present invention, the oscillating frequency and the oscillating frequency range also can be adjusted by using two controlled voltages.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, the constituting elements and the operating principles of the voltage controlled emitter-coupled multivibrator according to the present invention, will be explained in more detail with reference to the accompanying drawings.

Figure 1:
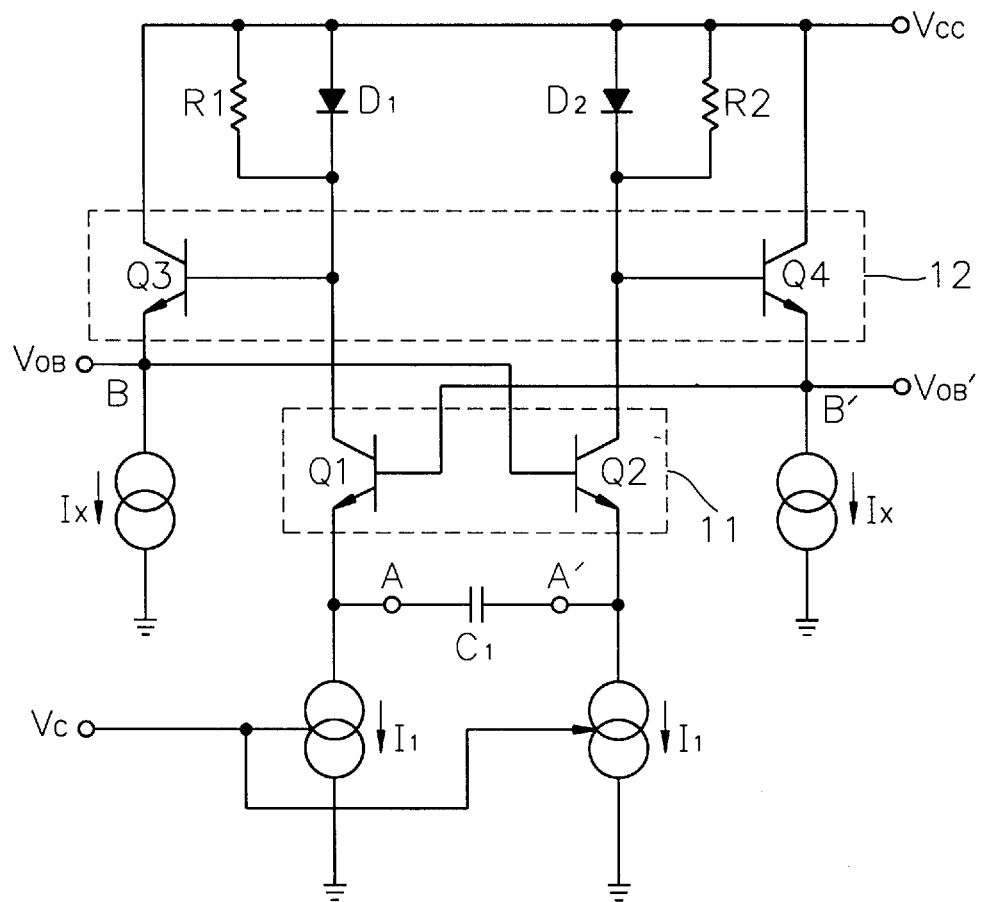
FIG. 1 is a circuit diagram for showing the constitution of the conventional EC multivibrator voltage controlled oscillator.
Figure 2A:
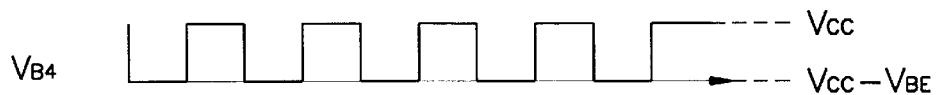
FIGS. 2A to 2G are waveforms with respect to each portion of each circuit illustrated in FIG. 1.
Figure 2B:
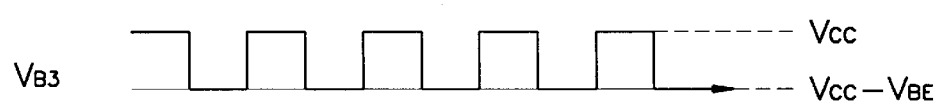
Figure 2C:
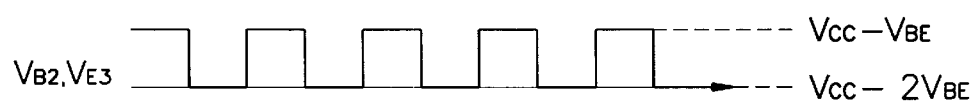
Figure 2D:
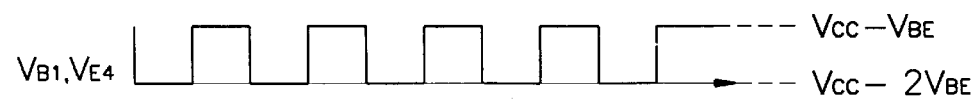
Figure 2E:
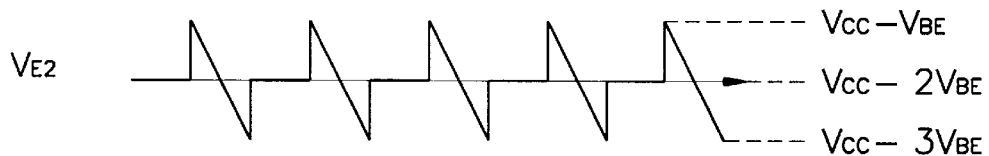
Figure 2F:
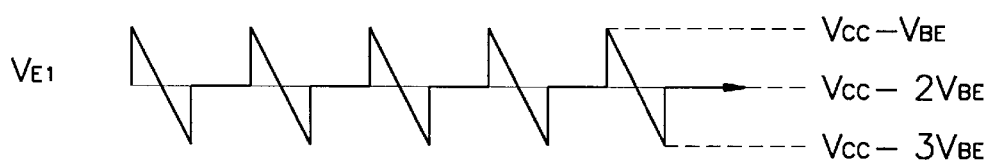
Figure 2G:
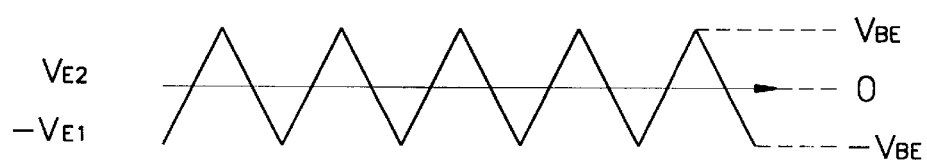
Figure 3:
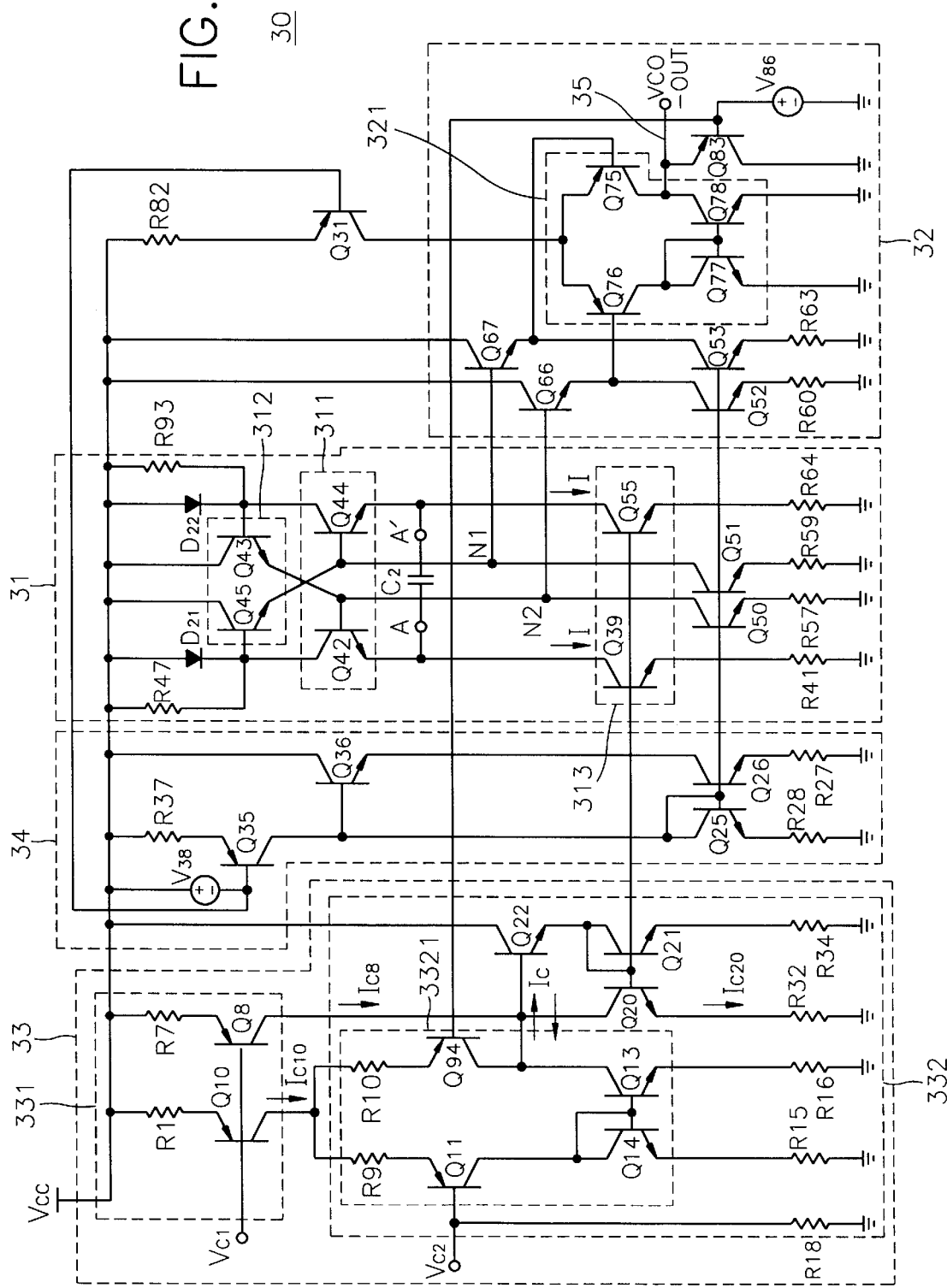
FIG. 3 is a circuit diagram for showing the constitution of a voltage controlled emitter-coupled multivibrator according to a preferred embodiment of the present invention.

FIG. 3 is a circuit diagram for showing the constitution of the voltage controlled emitter-coupled multivibrator according to the preferred embodiment of the present invention. An EC multivibrator voltage controlled oscillator 30 according to the present invention includes an EC multivibrator 31, an outputting section 32 and a controlling section 33. EC multivibrator 31 generates first and second oscillating signals. Outputting section 32 compares the first and the second oscillating signals and outputs a signal having a predetermined voltage level according to the compared result. Controlling section 33 controls the amount of a current passing through a current source 313 of EC multivibrator 31 by an applied voltage for controlling the frequency of the signal outputted through outputting section 32.

EC multivibrator 31 includes a gain stage 311, an emitter follower buffer 312 and current source 313. Gain stage 311 consists of first and second transistors Q44 and Q42. Emitter follower buffer 312 includes first and second transistors Q45 and Q43, and to the collector electrode of these transistors, a power voltage $V_{cc}$ is applied.

First and second transistors Q44 and Q42 of gain stage 311 are cross-coupled through first and second transistors Q45 and Q43 of emitter follower buffer 312. That is, the base electrode of first transistor Q44 of gain stage 311 is coupled to the emitter electrode of first transistor Q45 of emitter follower buffer 312, and the base electrode of second transistor Q42 of gain stage 311 is coupled to the emitter electrode of second transistor Q43 of emitter follower buffer 312. To the base electrodes of first and second transistors Q45 and Q43 of emitter follower buffer 312, power voltage $V_{cc}$ is applied through first and second load resistors R47 and R93 and first and second forward clamping diodes D21 and D22 which are respectively connected in parallel with first and second load resistors R47 and R93.

Gain stage 311 has first and second load resistors R47 and R93 (which have the same resistance) with first and second clamping diodes D21 and D22, respectively, which clamp the voltage swing across resistors R47 and R93 to $1V_{BE}$ (=0.7 V).

The emitters of first and second transistors Q44 and Q42 of gain stage 311 are biased by current source 313, consisting of transistors Q39 and Q55, and are combined by a timing capacitor $C_2$. That is, the emitter of first transistor Q44 of gain stage 311 is connected to the collector electrode of first transistor Q55 of current source 313, and the emitter electrode of second transistor Q42 is connected to the collector electrode of second transistor Q39 of current source 313. The emitter electrodes of first and second transistors Q55 and Q39 of current source 313 are, respectively earthed, through resistors R64 and R41, and the gate electrodes of first and second transistors Q55 and Q39 are commonly connected to controlling section 33. In addition, the contact of the base electrode of first transistor Q44 of gain stage 311 and the emitter electrode of first transistor Q45 of emitter follower buffer 312 is connected to outputting section 32 through a first node N1 and is earthed through a transistor Q51. That is, first node N1 is connected to the collector electrode of transistor Q51 and the emitter electrode of transistor Q51 is earthed through a resistor R59. The contact of the base electrode of second transistor Q42 of gain stage 311 and the emitter electrode of second transistor Q43 of emitter follower buffer 312 is connected to outputting section 32 through a second node N2 and is earthed through a transistor Q50. That is, second node N2 is connected to the collector electrode of transistor Q50 and the emitter electrode of transistor Q50 is earthed through resistor R57. The base electrodes of transistors Q50 and Q51 are commonly connected to a bias circuit 34 and to outputting section 32.

Outputting section 32 includes a differential amplifier 321 having an outputting line 35, transistors Q52, Q53, Q66, Q67 and Q83, and a reference voltage source $V_{86}$. The base electrode of transistor Q67 is connected to first node N1 of EC multivibrator 31 and the base electrode of transistor Q66 is connected to second node N2 of EC multivibrator 31. To the collector electrodes of transistors Q66 and Q67, power voltage $V_{cc}$ is applied and the emitter electrodes thereof are connected to differential amplifier 321. In addition, the contacts of the emitter electrodes of transistors Q66 and Q67 and differential amplifier 321 are respectively earthed through transistors Q52 and Q53 and resistors R60 and R63. That is, the contact of the emitter electrode of transistor Q66 and differential amplifier 321 is connected to the collector electrode of transistor Q52, and the emitter electrode of transistor Q52 is earthed through resistor R60. The contact of the emitter electrode of transistor Q67 and differential amplifier 321 is connected to the collector electrode of transistor Q53, and the emitter electrode of transistor Q53 is earthed through resistor R63. The base electrodes of transistors Q52 and Q53 are commonly connected to bias circuit 34 with transistors Q50 and Q51 of EC multivibrator 31.

Differential amplifier 321 includes a first transistor Q75, a second transistor Q76 and transistors Q77 and Q78 which form the current source. The base electrode of first transistor Q75 is connected to the emitter electrode of transistor Q67 and the base electrode of second transistor Q76 is connected to the emitter electrode of transistor Q66. To the emitter electrodes of first and second transistors Q75 and Q76, are commonly applied through a transistor Q31 and a resistor R82. That is, power voltage $V_{CC}$ is inputted to the emitter electrode of transistor Q31 through resistor R82 to power voltage $V_{cc}$. The base electrode of transistor Q31 is connected to bias circuit 34, and the collector electrode of transistor Q31 is commonly connected to the emitter electrodes of first and second transistors Q75 and Q76.

The emitter electrodes of transistors Q77 and Q78 which form the current source are earthed. The collector electrode of transistor Q77 is connected to the collector electrode of second transistor Q76, and the collector electrode of transistor Q78 is connected to the collector electrode of first transistor Q75. The base electrodes of transistors Q77 and Q78 are connected to each other, and the contact thereof is connected to the collector electrode of second transistor Q76. At the contact of first transistor Q75 and transistor Q78, a signal having a predetermined voltage level is outputted through outputting line 35.

The emitter electrode of transistor Q83 is connected to outputting line 35, the collector electrode thereof is earthed, and the base electrode thereof is connected to controlling section 33 with reference voltage $V_{86}$.

Controlling section 33 includes a controlling current generating circuit 331 and a current controlling circuit 332.

Controlling current generating circuit 331 consists of a pair of transistors Q10 and Q8 whose base terminals are commonly connected to a first controlling voltage source $V_{C1}$ and whose emitters are commonly connected to the power voltage through resistors R1 and R7. The collector electrodes of transistors Q10 and Q8 are connected to current controlling circuit 332. The first controlling voltage $V_{C1}$ is applied to generate a controlling current corresponding to a voltage from the first controlling voltage source.

Current controlling circuit 332 includes a differential amplifier 3321 having current sources Q13 and Q14. Differential amplifier 3321 includes a first transistor Q94 whose base terminal receives reference voltage $V_{86}$ and whose emitter terminal is connected to the collector terminal of transistor Q10 of controlling current generating circuit 331 through a degeneration resistor R10, a second transistor Q11 whose base terminal receives a second controlling voltage $V_{C2}$ and whose emitter terminal is connected to the collector terminal of transistor Q10 of controlling current generating circuit 331 through a degeneration resistor R9, and current sources Q13 and Q14. The base electrode of second transistor Q11 also is earthed through a resistor R18.

Differential amplifier 3321 includes the emitter degeneration resistors R10 and R9 for increasing the range of inputted voltage so as to act as a linear amplifier through being connected between the emitter terminals of first and second transistors Q94 and Q11.

The emitter electrodes of transistors Q13 and Q14 which form the current source are respectively earthed through resistors R16 and R15. The collector electrode of transistor Q14 is connected to the collector electrode of second transistor Q11, and the collector electrode of transistor Q13 is connected to the collector electrode of first transistor Q94. The base electrodes of transistors Q13 and Q14 are connected to each other and the contact thereof is connected to the collector electrode of second transistor Q11. From the contact between first transistor Q94 and transistor Q13, a controlling current Ic is outputted and applied to the base electrode of a transistor Q22. To the collector electrode of transistor Q22, power voltage $V_{cc}$ is applied. The contact between first transistor Q94 and transistor Q13 is connected to the collector electrode of transistor Q8 of controlling current generating circuit 331.

Controlling section 33 also includes the current source consisting transistors Q20 and Q21. The emitter electrodes of transistors Q20 and Q21 are respectively earthed through resistors R32 and R34. The collector electrode of transistor Q21 is connected to the emitter electrode of transistor Q22 and the collector electrode of transistor Q20 is connected to the contact of first transistor Q94 and transistor Q13. The base electrodes of transistors Q20 and Q21 are connected to each other, and the contact thereof is connected to the emitter electrode of transistor Q22. The contact between transistor Q20 and transistor Q21 is connected to the base electrode of first and second transistors Q55 and Q39 of current source 313 of EC multivibrator 31.

Bias circuit 34 includes first and second transistors Q35 and Q36, and a current source consisting of transistors Q25 and Q26, and power source $V_{38}$. Between the base electrode of first transistor Q35 and power voltage $V_{cc}$, power source $V_{38}$ is connected, and to the base electrode of first transistor Q35, the base electrode of transistor Q31 is connected. To the emitter electrode of first transistor Q35, power voltage $V_{cc}$ is applied through a resistor R37, and the collector electrode of first transistor Q35 is connected to the base electrode of second transistor Q36 and the collector electrode of transistor Q25. To the collector electrode of second transistor Q36, power voltage $V_{cc}$ is applied and the emitter electrode of second transistor Q36 is connected to the collector electrode of transistor Q26. The base electrodes of transistors Q25 and Q26 which form the current source are commonly connected to the base electrodes of transistors Q50 and Q51 of EC multivibrator and transistors Q52 and Q53 of outputting section 32. The emitter electrodes of transistors Q25 and Q26 are respectively earthed through resistors R28 and R27. In addition, the base electrode and the collector electrode of transistor Q25 are connected to each other to have an equal electric potential difference.

The operation of voltage controlled oscillator 30 having the above described constitution will be explained below.

Since first and second transistors Q44 and Q42 of gain stage 311 of EC multivibrator 31 are cross-coupled by first and second transistors Q45 and Q43 of emitter follower buffer 312, first and second transistors Q44 and Q42 are not on simultaneously but are on alternately. Accordingly, timing capacitor $C_2$ is alternately charged by a current having the same intensity and an opposite direction.

Figure 4A:
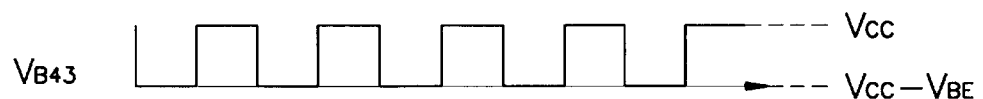
FIGS. 4A to 4H are waveforms with respect to each portion of each circuit illustrated in FIG. 3.
Figure 4B:
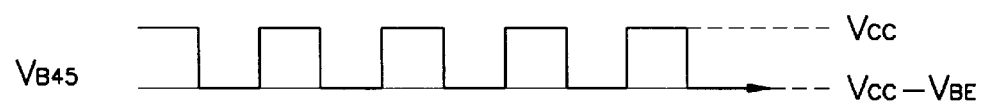
Figure 4C:
Figure 4D:
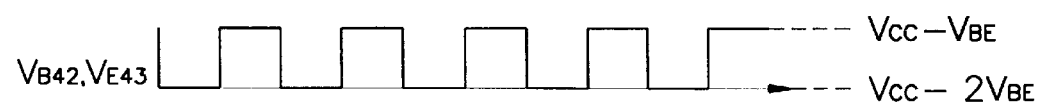
Figure 4E:
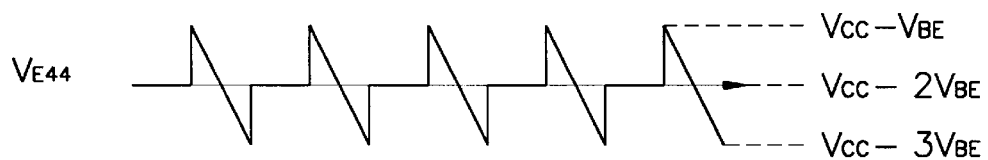

First, if first transistor Q44 of gain stage 311 is on, and if second transistor Q42 is off, then at the emitter of first transistor Q44 a total current of 2I flows, wherein one-half of the current is forced through timing capacitor $C_2$. At this time, the base voltage of second transistor Q43 of emitter follower buffer 312 is $V_{B43}=V_{cc}-V_{BE}$ (voltage between the base emitters) (FIG. 4A), and the emitter voltage of second transistor Q43 is $V_{E43}=V_{B42}$ (the base voltage of second transistor Q42 of the gain stage)$=V_{CC}-2V_{BE}$ (FIG. 4D). When neglecting the base current of first transistor Q45 of emitter follower buffer 312, the base voltage of first transistor Q45 of emitter follower buffer 312 is $V_{B45}=V_{cc}$ (FIG. 4B), and the emitter voltage is $V_{E45}=V_{B44}$ (the base voltage of first transistor Q44 of gain stage 311)$=V_{cc}-V_{BE}$ (FIG. 4C). The emitter voltage of first transistor Q44 of gain stage 311 is $V_{E44}=V_{CC}-2V_{BE}$ (FIG. 4E).

Since second transistor Q42 of gain stage 311 is off, current I for charging timing capacitor $C_2$ flows from the emitter of first transistor Q44, that is, flows from the point of A' to the point of A, and the slope of this current I declines at the constant slope of $I/C_2$ until the voltage level of emitter voltage $V_{E43}$ of second transistor Q42 becomes equal to $V_{CC}-3V_{BE}$. At this time, second transistor Q42 is on.

Figure 4F:
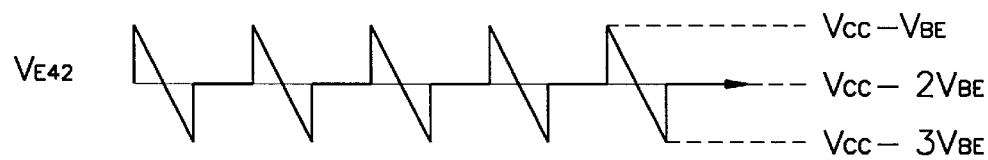
Figure 4G:
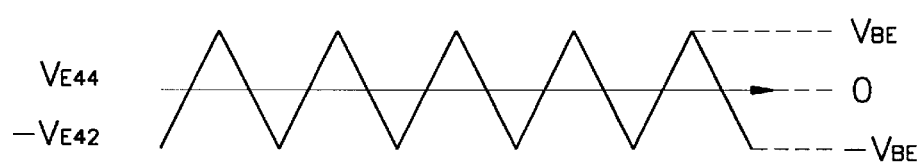

When second transistor Q42 is on, first diode D21 is on, the base voltage of first transistor Q45 is $V_{B45}=V_{cc}-V_{BE}$ (FIG. 4B), the emitter voltage of first transistor Q45 is $V_{E45}=V_{B44}$ (the base voltage of second transistor Q44 of gain stage 311)$=V_{CC}-2V_{BE}$ (FIG. 4C), and first transistor Q44 is off. When second transistor Q44 is off, the base voltage of second transistor Q43 of emitter follower buffer 312 is $V_{B43}=V_{cc}$ (FIG. 4A), the emitter voltage of second transistor Q43 is $V_{E43}=V_{B42}$ (the base voltage of second transistor Q42 of the gain stage)$=V_{cc}-V_{BE}$ (FIG. 4D), and the emitter voltage of second transistor Q42 of the gain stage is $V_{E42}=V_{CC}-2V_{BE}$ (FIG. 4F). At this time, the base-collector combination of first transistor Q44 of gain stage 311 becomes the state of having $IV_{BE}$ reverse vias voltage. Therefore, the state thereof is changed. At this time, timing capacitor $C_2$ causes constant current I to flow in the opposite direction (that is, from A to A') and to discharge through first transistor Q55 of current source 313. When $V_{E44}=V_{CC}-3V_{BE}$ (FIG. 4E), the state changes to the original state, and constant first and second frequency signals ($V_{E44}-V_{E42}$ of FIG. 4G) are oscillated through the operation.

As illustrated in FIGS. 4A to 4F, the half-period of the oscillating frequency by EC multivibrator 31 is the same as the time for discharging the voltages at both ends of timing capacitor $C_2$ by $2V_{BE}$ by means of constant current I. That means the following equation.

$$\Delta t = C_2 \Delta V / I = 2C_2 V_{BE}/I$$

Accordingly, the oscillating frequency is determined as the equation of $f_0 = 1/\Delta t = I/(4C_2 V_{BE})$.

Figure 4H:
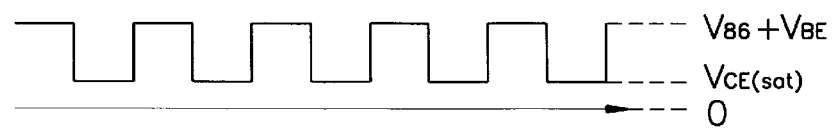

Outputting section 32 compares a first voltage level of the first oscillating signal with a second voltage level of the second oscillating signal from EC multivibrator 31 and outputs a signal having a predetermined voltage level of $V_{86}+V_{BE}$ according to the compared result, as shown in FIG. 4H. Here, $V_{BE}$ represents the voltage of the base-emitter of first and second transistors Q44 and Q42 of gain stage 311.

When first node N1, i.e. the first oscillating signal, is high and second node N2, i.e. the second oscillating signal, is low, transistor Q67 of outputting section 32 is on and transistor Q66 of outputting section 32 is off. Therefore, the emitter of transistor Q67, that is, the base voltage of first transistor Q75 of differential amplifier 321, is high and the emitter of transistor Q66, that is, the base voltage of second transistor Q76 of differential amplifier 321, is low. Accordingly, outputting line 35 outputs a low signal.

Current I which flows through first and second transistors Q55 and Q39 of current source 313 is adjusted by first and second controlling voltages $V_{C1}$, and $V_{C2}$.

Controlling current generating circuit 331 consists of a pair of transistors Q10 and Q8 whose base terminals are commonly connected to first controlling voltage source $V_{C1}$ and whose emitters are commonly connected to the power voltage through resistors R1 and R7, and generates controlling currents $I_{C10}$ and $I_{C20}$ (the outputting currents from the collectors of transistors Q10 and Q8) by the voltage from the first voltage source to provide the generated currents to current controlling circuit 332 for controlling the current amount of EC multivibrator 31.

Current controlling circuit 332 includes differential amplifier 3321 having current sources Q13 and Q14. Differential amplifier 3321 includes first transistor Q94 whose base terminal receives reference voltage $V_{86}$ and whose emitter terminal is connected to the collector terminal of transistor Q10 of controlling current generating circuit 331 through degeneration resistor R10, second transistor Q11 whose base terminal receives the controlling voltage and whose emitter terminals are commonly connected to the collector terminal of transistor Q10 of controlling current generating circuit 331 through degeneration resistor R9, and current sources Q13 and Q14. Differential amplifier 3321 is connected between the emitter terminals of first and second transistors Q94 and Q11 and further comprises emitter degeneration resistors R9 and R10 for increasing the inputting voltage range to act as the linear amplifier.

Current I which flows through first and second transistors Q55 and Q39 of current source 313 is adjusted by first and second controlling voltages $V_{C1}$ and $VC_{C2}$.

The controlling method of the oscillating frequency of the voltage controlled oscillator by second controlling voltage $V_{C2}$ of current controlling circuit 332 will be explained.

The base voltage of first transistor Q94 of differential amplifier 3321 of current controlling circuit 332 is fixed by the voltage source and second controlling voltage $V_{C2}$ is inputted to the base of second transistor Q11 of differential amplifier 3321. Accordingly, the range of second controlling voltage $V_{C2}$ for the linear operation of differential amplifier 3321 is $V_{86} \pm I_{C10} \times R9$ (or R10). $V_{86}$ can be set to e.g. 2.5 volts and is the collector current of transistor Q10.

At this time, controlling current $Ic=gm/(1+gm)(R9\times383 V_{C2})$, and the maximum value of Ic is $\pm I_{C10}$.

Since $I_{C20}$ (the outputting current from the collector of transistor Q20) is controlled by controlling current Ic, charging and discharging current I of timing capacitor $C_2$ can be controlled. Accordingly, oscillating frequency $f_0$ can be controlled. That is, the oscillating frequency is as follows.

$$f_0 = \tfrac{1}{4} \times C_2 \times V_{BE} = (R32/R41 \times I_{C20})/(4 \times C_2 \times V_{BE}) = (R32/R41) \times (I_{C8} + Ic)/(4 \times C_2 \times V_{BE}) = (R32/R41 \times [I_{C8} + (gm \times V_{C2})/(1+gm) \times R9])/(4 \times C_2 \times V_{BE})$$

The method for determining the oscillating frequency range by first controlling voltage $V_{C1}$ of controlling current generating circuit 331 will be described below.

First controlling voltage $V_{C1}$ controls constant currents $I_{C8}$ and $I_{C10}$ of constant current source Q10 of differential amplifier 3321.

$$I_{C10}=(V_{CC}-V_{C1}-V_{BE})/RI, \quad I_{C8}=(V_{CC}-V_{C1}-V_{BE})/R7$$

Accordingly, when first controlling voltage $V_{C1}$ is changed, the maximum value of Ic which is controlled by second controlling voltage $V_{C2}$ is changed to change the oscillating frequency range.

When first controlling voltage $V_{C1}$ increases, the maximum value of Ic is reduced to lower the oscillating frequency range, and when first controlling voltage $V_{C1}$ decreases, the maximum value of Ic is increased to heighten the oscillating frequency range.

As described above, the oscillating frequency and the oscillating frequency range can be adjusted by using two controlling voltages. Accordingly, the voltage controlled oscillator of the present invention can be used in a wide range of oscillators from a low frequency oscillator to a high frequency oscillator.

Although the preferred embodiment of the invention has been described, it is understood that the present invention should not be limited to the preferred embodiment, but various changes and modifications can be made by one skilled in the art within the spirit and scope of the invention as hereinafter claimed.

What is claimed is:

1. A voltage controlled emitter-coupled multivibrator comprising:

an emitter-coupled multivibrator for generating first and second oscillating signals, the first oscillating signal being out of phase with the second oscillating signal, said emitter-coupled multivibrator being provided with an emitter follower buffer having first and second transistors, a gain stage having third and fourth transistors which are cross-coupled through said first and second transistors, a timing capacitor for coupling emitters of said third and fourth transistors, and a current source connected to said emitters of said third and said fourth transistors;

an outputting section for comparing a first voltage level of said first oscillating signal with a second voltage level of said second oscillating signal and outputting a compared signal of said first and second oscillating signals having a predetermined voltage level; and a controlling section for outputting a controlling current which controls an amount of a current which flows through said current source of said emitter-coupled multivibrator by receiving a first controlling voltage for controlling a frequency range of said compared signal outputted through said outputting section, and by receiving a reference voltage of the compared signal and a second controlling voltage for controlling a frequency of the compared signal.

2. The voltage controlled emitter-coupled multivibrator as claimed in claim 1, wherein the frequency range of said compared signal is determined by said amount of said current which flows from said current source.

3. The voltage controlled emitter-coupled multivibrator as claimed in claim 1, wherein said controlling section comprises a controlling current generating circuit for generating a controlling current corresponding to said first controlling voltage for determining said frequency range of said compared signal generated by said outputting section, and a current controlling circuit for controlling said amount of said current which flows from said current source of said emitter-coupled multivibrator corresponding to the second controlling voltage for controlling said frequency within said determined frequency range.

4. The voltage controlled emitter-coupled multivibrator as claimed in claim 3, wherein said controlling current generating circuit comprises a pair of transistors whose base terminals are commonly connected to a source of said first controlling voltage and whose emitters are connected to a power voltage.

5. The voltage controlled emitter-coupled multivibrator as claimed in claim 3, wherein said current controlling circuit comprises a differential amplifier having a first transistor whose base terminal receives the reference voltage and whose emitter terminal is connected to said controlling current generating circuit, and a second transistor whose base terminal receives the second controlling voltage and whose emitter terminal is connected to said controlling current generating circuit.

6. The voltage controlled emitter-coupled multivibrator as claimed in claim 5, wherein said differential amplifier further comprises a pair of emitter resistors for increasing a range of said second controlling voltage so that said differential amplifier acts as a linear amplifier, said emitter resistors being connected between said emitter terminals of said first and second transistors and said controlling current generating circuit.

7. A voltage controlled emitter-coupled multivibrator comprising:

an emitter-coupled multivibrator for generating first and second oscillating signals, the first oscillating signal being out of phase with the second oscillating signal, said emitter-coupled multivibrator having an emitter follower buffer having first and second transistors, a gain stage having third and fourth transistors which are cross-coupled through said first and second transistors, a timing capacitor for coupling emitters of said third and fourth transistors, and a current source connected to said emitters of said third and said fourth transistors;

an outputting section for comparing a first voltage level of said first oscillating signal with a second voltage level of said second oscillating signal and outputting a compared signal of said first and second oscillating signals having a predetermined voltage level; and a controlling section including a controlling current generating circuit having a pair of transistors whose base terminals are commonly connected to a source of a first controlling voltage and whose emitters are connected to a power voltage, for generating a controlling current by receiving said first controlling voltage for determining a frequency range of said compared signal generated from said outputting section; and a current controlling circuit comprising a differential amplifier having a first transistor whose base terminal receives a reference voltage of the compared signal and whose emitter terminal is connected to said controlling current generating circuit, and a second transistor whose base terminal receives a second controlling voltage and whose emitter terminal is connected to said controlling current generating circuit, for controlling an amount of a current which flows from said current source of said emitter-coupled multivibrator by receiving said first controlling voltage for controlling a frequency range of said compared signal, and by receiving the reference voltage of the compared signal and the second controlling voltage for controlling the frequency of the compared signal.

8. The voltage controlled emitter-coupled multivibrator as claimed in claim 7, wherein said differential amplifier further comprises a pair of emitter resistors for increasing a range of said second controlling voltage so that said differential amplifier acts as a linear amplifier, said emitter resistors being connected between said emitter terminals of said first and second transistors and said controlling current generating circuit.

* * * * *